(12) United States Patent
Hwang et al.

(10) Patent No.: US 7,852,131 B2
(45) Date of Patent: Dec. 14, 2010

(54) RECEIVER CIRCUIT OF SEMICONDUCTOR MEMORY APPARATUS

(75) Inventors: Tae-Jin Hwang, Ichon (KR); Kun-Woo Park, Ichon (KR); Yong-Ju Kim, Ichon (KR); Hee-Woong Song, Ichon (KR); Ic-Su Oh, Ichon (KR); Hyung-Soo Kim, Ichon (KR); Hae-Rang Choi, Ichon (KR); Ji-Wang Lee, Ichon (KR)

(73) Assignee: Hynix Semiconductor Inc. (KR)

( * ) Notice: Subject to any disclaimer, the term of this patent is extended or adjusted under 35 U.S.C. 154(b) by 321 days.

(21) Appl. No.: 12/175,224

(22) Filed: Jul. 17, 2008

(65) Prior Publication Data

US 2009/0128200 A1    May 21, 2009

(30) Foreign Application Priority Data

Nov. 15, 2007    (KR) ..................... 10-2007-0116380

(51) Int. Cl.
*H03L 7/00* (2006.01)
(52) U.S. Cl. ................. 327/144; 327/108; 327/109; 327/110; 327/112; 327/333
(58) Field of Classification Search ........... 327/108, 327/144, 333
See application file for complete search history.

(56) References Cited

U.S. PATENT DOCUMENTS

| | | | |
|---|---|---|---|
| 7,124,221 B1 | 10/2006 | Zerbe et al. | |
| 7,176,721 B2 | 2/2007 | Ho et al. | |
| 7,212,580 B2 | 5/2007 | Hietala et | |
| 2009/0058476 A1* | 3/2009 | Oh et al. | 327/144 |

FOREIGN PATENT DOCUMENTS

KR    1020040009269    1/2004

* cited by examiner

*Primary Examiner*—Lincoln Donovan
*Assistant Examiner*—John W Poos
(74) *Attorney, Agent, or Firm*—Baker & McKenzie LLP

(57) ABSTRACT

A receiver circuit capable of controlling setup/hold time includes a first phase transmission unit configured to generate a first output signal by detecting input data according to plural detection levels while being synchronized with a first clock signal, and controlling setup/hold time of the first output signal based on a level of a first offset voltage, a level converter configured to control a voltage level of the first output signal according to a first code, and a second phase transmission unit configured to receive an output signal of the level converter for as a second offset voltage while being synchronized with a second clock signal, to generate a second output signal by detecting the input data according to the detection levels, and to control setup/hold time of the second output signal.

8 Claims, 5 Drawing Sheets

RECEIVER CIRCUIT OF SEMICONDUCTOR MEMORY APPARATUS

CROSS-REFERENCES TO RELATED APPLICATION

The present application claims priority under 35 U.S.C. 119(a) to Korean application number 10-2007-0116380, filed in the Korean Intellectual Property Office on Nov. 15, 2007, which is incorporated by reference in its entirety as if set forth in full.

BACKGROUND

1. Technical Field

The embodiments herein relate to a semiconductor integrated circuit, and more particularly, to a receiver circuit of the semiconductor integrated circuit.

1. Related Art

In a conventional semiconductor apparatus, such as a semiconductor memory, a receiver circuit employed as an interface circuit receives an external signal, buffers the received signal, and then transfers the buffered signal to an internal circuit of the chip. When the receiver circuit determines external input data and outputs the external input data as internal data, the setup/hold time of the internal data is an important factor for determining high speed response characteristics of the receiver circuit.

With the rapid increase in the speed of components in a computer, a semiconductor integrated circuit requires low power supply voltage and high speed interfaces. Furthermore, as the demand for a receiver circuit operating at a high speed is increased, a receiver circuit capable of controlling the setup/hold time of internal data is required.

SUMMARY

A receiver circuit capable of controlling setup/hold time is described herein.

According to one aspect, a receiver circuit comprises a first phase transmission unit configured to generate a first output signal by detecting input data according to plural detection levels while being synchronized with a first clock signal, and controlling setup/hold time of the first output signal based on a level of a first offset voltage, a level converter for controlling a voltage level of the first output signal according to a first code, and a second phase transmission unit configured to receive an output signal of the level converter as a second offset voltage, while being synchronized with a second clock signal, to generate a second output signal by detecting the input data according to the detection levels, and to control setup/hold time of the second output signal.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
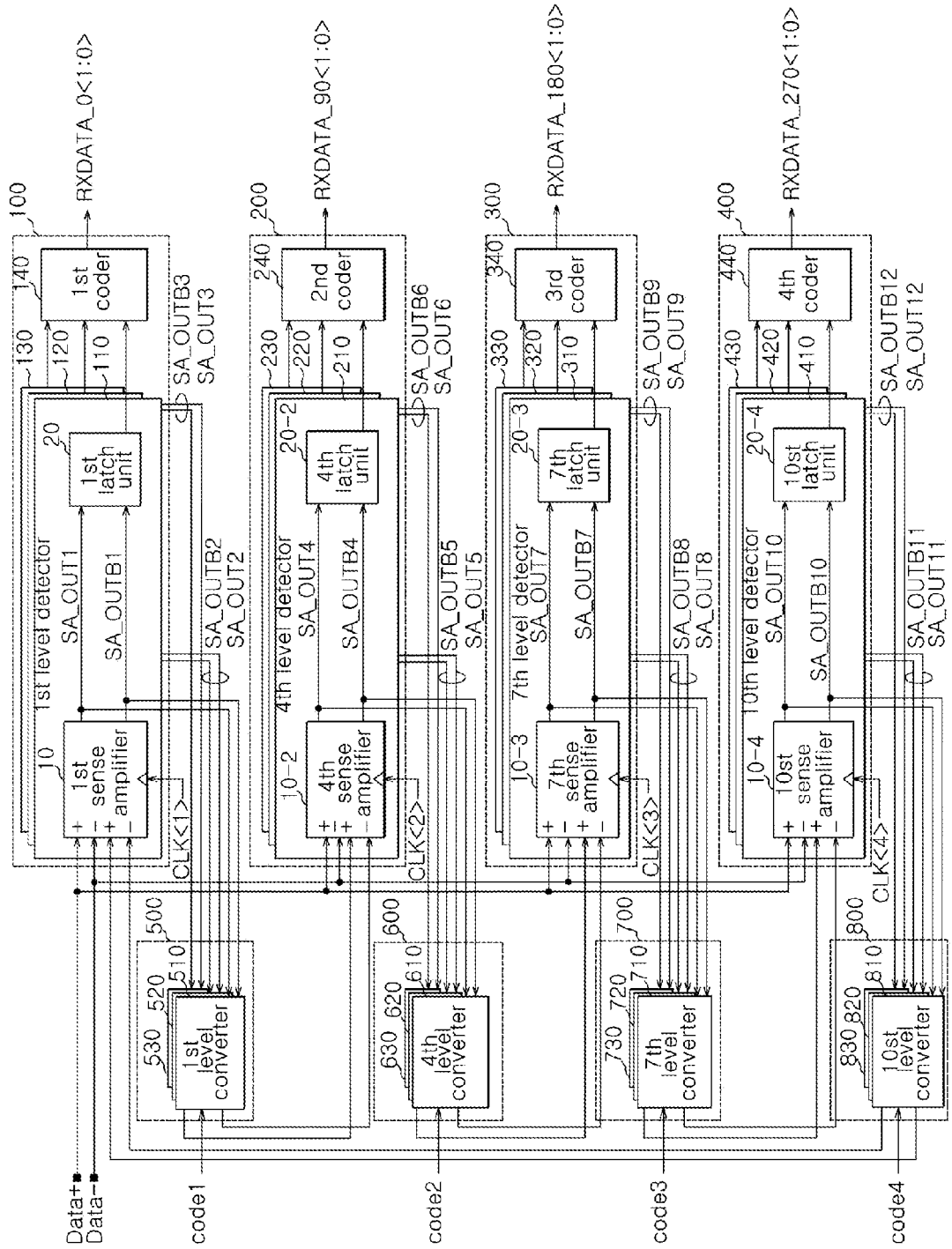
FIG. 1 is a block diagram illustrating a receiver circuit according to one embodiment described herein.

FIG. 1 is a block diagram illustrating a receiver circuit according to one embodiment described herein. Referring to FIG. 1, a receiver circuit can include first to fourth phase transmission units 100, 200, 300 and 400, and first to fourth level conversion units 500, 600, 700 and 800.

The first phase transmission unit 100 can be configured to generate first output signals 'SA_OUT1'/'SA_OUTB1', 'SA_OUT2'/'SA_OUTB2', and 'SA_OUT3'/'SA_OUTB3' by detecting input data 'Data+' and 'Data−' according to plural detection levels. Further, the first phase transmission unit 100 can be configured to operate by synchronizing with a first clock signal 'CLK<1>' and control the setup/hold time of the first output signals 'SA_OUT4'/'SA_OUTB4', 'SA_OUT5'/'SA_OUTB5', and 'SA_OUT6'/'SA_OUTB6' in response to one of first offset voltages.

The input data 'Data+' and 'Data−' can be prepare in the form of a pair and can be transmitted to the first to fourth phase transmission units 100, 200, 300 and 400.

Figure 5A:
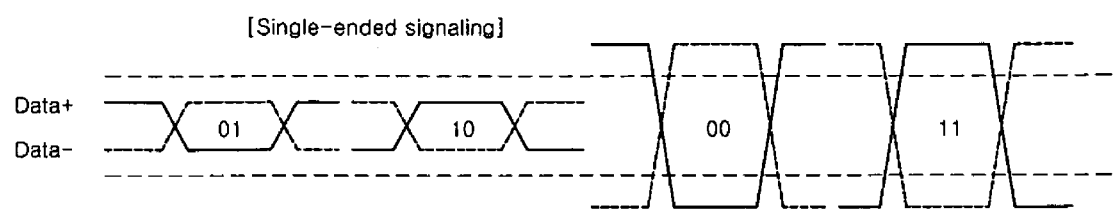
FIGS. 5A and 5B are views illustrating waveforms of input data according to one embodiment described herein.
Figure 5B:
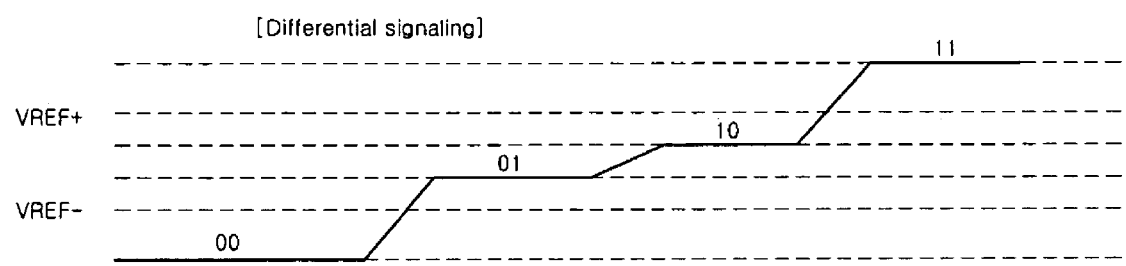

FIGS. 5A and 5B are views illustrating waveforms of input data according to one embodiment described herein. As shown in FIG. 5A, the phases of the input data 'Data+' and 'Data−' can be classified as 00, 01, 10 and 11 according to the size of the input data 'Data+' and 'Data−'. Further, as shown in FIG. 5B, the input data 'Data+' and 'Data−' may be indicated by 00, 01, 10 and 11 according to differential signaling. The differential signaling refers to a scheme of differentiating information of the input data 'Data+' and 'Data−' according to voltage difference between the input data 'Data+' and 'Data−'.

The first phase transmission unit 100 can include first to third level detectors 110, 120, and 130 and a first coder 140. The first to third level detectors 110, 120, and 130 can provide the plural detection levels for generating the first output signals 'SA_OUT1'/'SA_OUTB1', 'SA_OUT2'/'SA_OUTB2', and 'SA_OUT3'/'SA_OUTB3'. The first to third level detectors 110, 120 and 130 can include a sense amplifier and a latch, respectively. At that time, the first offset voltage can be an offset voltage of the sense amplifier 10 in the first phase transmission unit 100. For example, when the first output signal 'SA_OUT1'/'SA_OUTB1' is generated, the first offset voltage can become the offset voltage of the sense amplifier 10 in the first level detector 110. Further when the first output signal 'SA_OUT2'/'SA_OUTB2' is generated, the first offset voltage can become the offset voltage of the sense amplifier 20 (refer to FIG. 2) in the second level detector 120.

The second phase transmission unit 200 can generate second output signals 'SA_OUT4'/'SA_OUTB4', 'SA_OUT5'/'SA_OUTB5' and 'SA_OUT6'/'SA_OUTB6' by detecting the input data 'Data+' and 'Data−' according to the plural detection levels. Further, the second phase transmission unit 200 is configured to operate by synchronizing with a second clock signal 'CLK<2>', and can control the setup/hold time of the second output signals 'SA_OUT4'/'SA_OUTB4'

'SA_OUT5'/'SA_OUTB5', 'SA_OUT6'/'SA_OUTB6' by receiving an output signal of the first level conversion unit 500 as second offset voltages. Also the second offset voltage may represent an offset voltage of a sense amplifier 10-2 in the second phase transmission unit 200. The second phase transmission unit 200 can also include fourth to sixth level detectors 210, 220 and 230 and a second coder 240. The fourth to sixth level detectors 210, 220 and 230 can provide the plural detection levels for generating the second output signals 'SA_OUT4'/'SA_OUTB4', 'SA_OUT5'/'SA_OUTB5' and 'SA_OUT6'/'SA_OUTB6'.

The third phase transmission unit 300 can generate third output signals 'SA_OUT7'/'SA_OUTB7', 'SA_OUT8'/'SA_OUTB8' and 'SA_OUT9'/'SA_OUTB9' by detecting the input data 'Data+' and 'Data−' according to the plural detection levels. Further, the third phase transmission unit 300 can be configured to operate by synchronizing with a third clock signal 'CLK<3>', and control the setup/hold time of the third output signals 'SA_OUT7'/'SA_OUTB7', 'SA_OUT8'/'SA_OUTB8' and 'SA_OUT9'/'SA_OUTB9' by receiving an output signal of the second level conversion unit 600 as a third offset voltage. Also the third offset voltage may represent an offset voltage of a sense amplifier 10-3 in the third phase transmission unit 300. The third phase transmission unit 300 may include seventh to ninth level detectors 310, 320, and 330 and a third coder 340. The seventh to ninth level detectors 310, 320, and 330 can provide the plural detection levels for generating the third output signals 'SA_OUT7'/'SA_OUTB7', 'SA_OUT8'/'SA_OUTB8' and 'SA_OUT9'/'SA_OUTB9'.

The fourth phase transmission unit 400 can generate fourth output signals 'SA_OUT10'/'SA_OUTB10', 'SA_OUT11'/'SA_OUTB11' and 'SA_OUT12'/'SA_OUTB12' by detecting the input data 'Data+' and 'Data−' according to the plural detection levels. Further, the fourth phase transmission unit 400 can be configured to operate by synchronizing with a fourth clock signal 'CLK<4>', and can control the setup/hold time of the fourth output signals 'SA_OUT10'/'SA_OUTB10', 'SA_OUT11'/'SA_OUTB11' and 'SA_OUT12'/'SA_OUTB12' by receiving an output signal of the third level conversion unit 700 as a fourth offset voltage. Also, the fourth offset voltage can represents an offset voltage of a sense amplifier 10-4 in the fourth phase transmission unit 400. The fourth phase transmission unit 400 can include tenth to twelfth level detectors 410, 420 and 430 and a fourth coder 440. The tenth to twelfth level detectors 410, 420 and 430 can provide the plural detection levels for generating the fourth output signals 'SA_OUT10'/'SA_OUTB10', 'SA_OUT11'/'SA_OUTB11' and 'SA_ OUT11'/'SA_OUTB11'.

The first level conversion unit 500 can be configured to control the voltage levels of the first output signals 'SA_OUT1'/'SA_OUTB1', 'SA_OUT2'/'SA_OUTB2' and 'SA_OUT3'/'SA_OUTB3' according to a first code "code 1". The controlled first output signals can be input to a second offset voltage terminal of the second phase transmission unit 200.

The first level conversion unit 500 can include first to third level converters 510, 520 and 530. The first level converter 510 can receive the first output signal 'SA_OUT1'/'SA_OUTB1', can convert the level of the first output signal 'SA_OUT1'/'SA_OUTB1', and can transmit the converted first output signal to the fourth level detector 210. The second level converter 520 can receive the first output signal 'SA_OUT2'/'SA_OUTB2' of the second level detector 120, can convert the level of the first output signal 'SA_OUT2'/'SA_OUTB2' and can transmit the converted first output signal to the fifth level detector 220. The third level converter 530 can receive the first output signal 'SA_OUT3'/'SA_OUTB3' of the third level detector 130, can convert the level of the first output signal 'SA_OUT3'/'SA_OUTB3' and can transmit the output signal to the sixth level detector 230.

The second level conversion unit 600 can be configured to control the voltage levels of the second output signals 'SA_OUT4'/'SA_OUTB4', 'SA_OUT5'/'SA_OUTB5' and 'SA_OUT6'/'SA_OUTB6' according to a second code "code 2". The controlled second output signals 'SA_OUT4'/'SA_OUTB4', 'SA_OUT5'/'SA_OUTB5' and 'SA_OUT6'/'SA_OUTB6' can be input to a third offset voltage terminal of the third phase transmission unit 300. The second level conversion unit 600 may include fourth to sixth level converters 610, 620 and 630. The fourth to sixth level converters 610, 620 and 630 can receive the second output signals 'SA_OUT4'/'SA_OUTB4', 'SA_OUT5'/'SA_OUTB5' and 'SA_OUT6'/'SA_OUTB6' of the fourth to sixth level detectors 210, 220 and 230 of the second phase transmission unit 200, respectively. The second output signals 'SA_OUT4'/'SA_OUTB4', 'SA_OUT5'/'SA_OUTB5' and 'SA_OUT6'/'SA_OUTB6' can be converted by the fourth to six level converters 610, 620 and 630, respectively. The converted second output signal can be input to the seventh to ninth level detectors 310, 320 and 330 of the third phase transmission unit 300, respectively.

The third level conversion unit 700 can be configured to control the voltage levels of the third output signals 'SA_OUT7'/'SA_OUTB7', 'SA_OUT8'/'SA_OUTB8' and 'SA_OUT9'/'SA_OUTB9' according to a third code "code 3". The controlled third output signals 'SA_OUT7'/'SA_OUTB7', 'SA_OUT8'/'SA_OUTB8' and 'SA_OUT9'/'SA_OUTB9' can be input to a fourth offset voltage terminal of the fourth phase transmission unit 400. The third level conversion unit 700 can include seventh to ninth level converters 710, 720 and 730. The seventh to ninth level converters 710, 720 and 730 can receive the third output signals 'SA_OUT7'/'SA_OUTB7', 'SA_OUT8'/'SA_OUTB8' and 'SA_OUT9'/'SA_OUTB9' of the seventh to ninth level detectors 310, 320 and 330 of the third phase transmission unit 300. The third output signals 'SA_OUT7'/'SA_OUTB7', 'SA_OUT8'/'SA_OUTB8' and 'SA_OUT9'/'SA_OUTB9' can be converted by the seventh to ninth level converters 710, respectively. The converted third output signals can be input the tenth to twelfth level detectors 410, 420 and 430 of the fourth phase transmission unit 400, respectively.

The fourth level conversion unit 800 can control the voltage levels of the fourth output signals 'SA_OUT10'/'SA_OUTB10', 'SA_OUT11'/'SA_OUTB11' and 'SA_OUT12'/'SA_OUTB12' according to a fourth code "code 4". The controlled fourth output signals 'SA_OUT10'/'SA_OUTB10', 'SA_OUT11'/'SA_OUTB11' and 'SA_OUT12'/'SA_OUTB12' can be transmitted to a first offset voltage terminal of the first phase transmission unit 100. The fourth level conversion unit 800 can include tenth to twelfth level converters 810, 820 and 830. The tenth to twelfth level converters 810, 820 and 830 can receive the fourth output signals 'SA_OUT10'/'SA_OUTB10', 'SA_OUT11'/'SA_OUTB11' and 'SA_OUT12'/'SA_OUTB12' of the tenth to twelfth level detectors 410, 420 and 430 of the fourth phase transmission unit 400, respectively. The fourth output signals 'SA_OUT10'/'SA_OUTB10', 'SA_OUT11'/'SA_OUTB11' and 'SA_OUT12'/'SA_OUTB12' can be converted by the tenth to twelfth level converters 810, 820 and 830, respectively. The converted fourth output signals can be input to the first to third level detectors 110, 120 and 130 of the first phase transmission unit 100, respectively.

Figure 2:
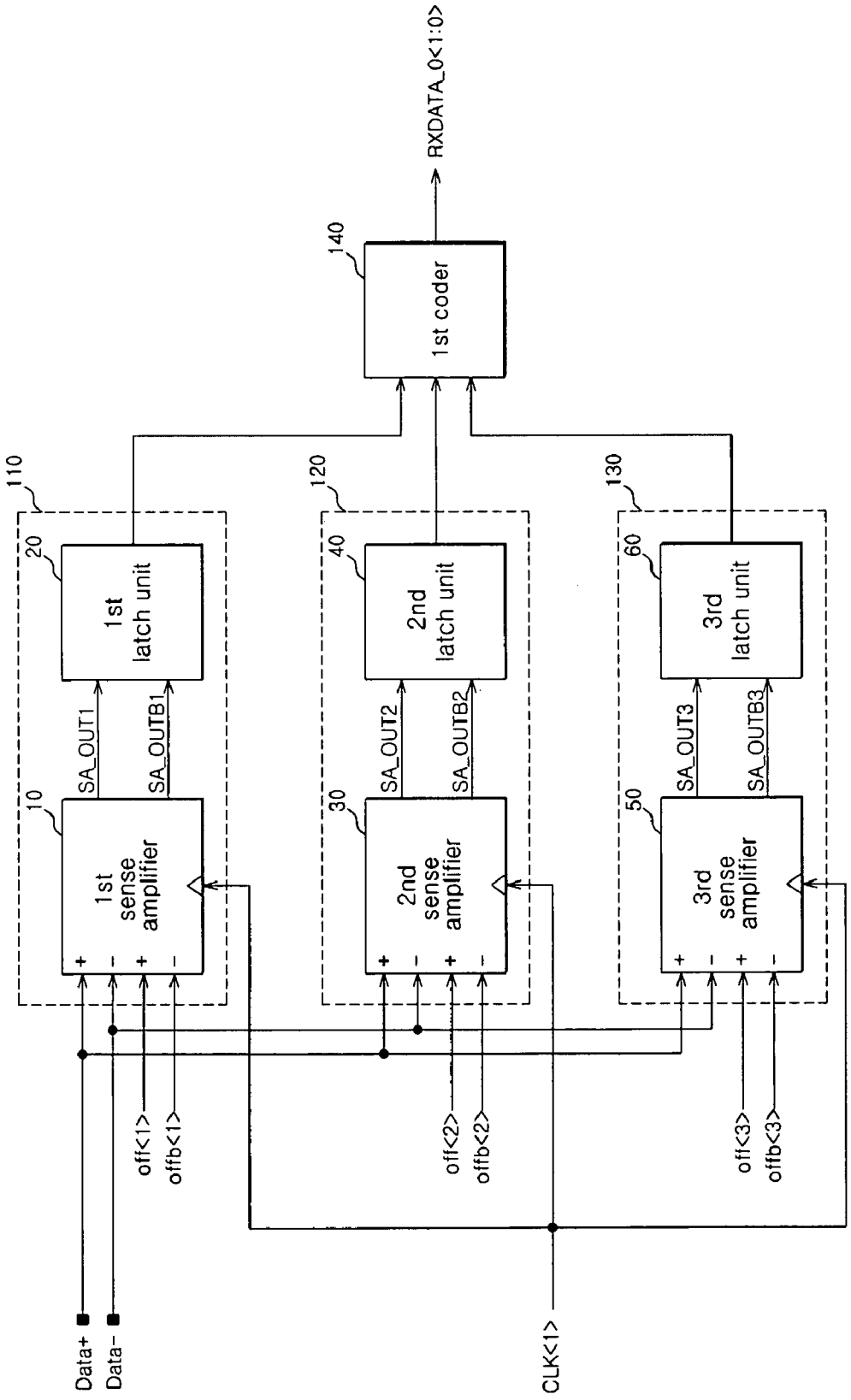
FIG. 2 is a detailed block diagram illustrating the first phase transmission unit that can be included in the circuit of FIG. 1.

FIG. 2 is a detailed block diagram illustrating the first phase transmission unit that can be included in the circuit of FIG. 1. Referring to FIG. 2, the first phase transmission unit 100 can include the first to third level detectors 110, 120 and 130 and the first coder 140.

The first level detector 110 can detect a signal having a first level or more from the input data 'Data+' and 'Data−', and can amplify the signal, thereby generating the first detection signals 'SA_OUT1' and 'SA_OUTB1'. Further, the first level detector 110 can control the setup/hold time of the first detection signals 'SA_OUT1' and 'SA_OUTB1' according to first voltages 'off<1>' and 'offb<1>' of the first offset voltage. The first voltages 'off<1>' and 'offb<1>' can correspond to output of the tenth level converter 810, and the first detection signals 'SA_OUT1' and 'SA_OUTB1' can be input to the first level converter 510.

The first level detector 110 can include a first sense amplifier 10 and a first latch unit 20. The first sense amplifier 10 can detect the signal having the first level or more from the input data 'Data+' and 'Data−', and amplify the signal. The first latch unit 20 can latch the first detection signals 'SA_OUT1' and 'SA_OUTB1' and then transmit the first detection signals 'SA_OUT1' and 'SA_OUTB1' to the first coder 140.

The second level detector 120 can detect a signal having a second level or more from the input data 'Data+' and 'Data−', and can amplify the signal, thereby generating the second detection signals 'SA_OUT2' and 'SA_OUTB2'. Further, the second level detector 120 can control the setup/hold time of the second detection signals 'SA_OUT2' and 'SA_OUTB2' according to second voltages 'off<2>' and 'offb<2>' of the first offset voltage. The second voltages 'off<2>' and 'offb<2>' can correspond to output of the eleventh level converter 820, and the second detection signals 'SA_OUT2' and 'SA_OUTB2' can be input to the second level converter 520.

The second level detector 120 can include a second sense amplifier 30 and a second latch unit 40. The second sense amplifier 30 can detect the signal having the second level or more from the input data 'Data+' and 'Data−', and can amplify the signal. The second latch unit 40 can latch the second detection signals 'SA_OUT2' and 'SA_OUTB2' and then can transmit the second detection signals 'SA_OUT2' and 'SA_OUTB2' to the first coder 140.

The third level detector 130 can detect a signal having a third level or more from the input data 'Data+' and 'Data−', and can amplify the signal, thereby generating the third detection signals 'SA_OUT3' and 'SA_OUTB3'. Further, the third level detector 130 can control the setup/hold time of the third detection signals 'SA_OUT3' and 'SA_OUTB3' according to third voltages 'off<3>' and 'offb<3>' of the first offset voltage. The third voltages 'off<3>' and 'offb<3>' can correspond to output of the twelfth level converter 830, and the third detection signals 'SA_OUT3' and 'SA_OUTB3' can be input to the third level converter 530 (Refer to FIG. 1).

The third level detector 130 can include a third sense amplifier 50 and a third latch unit 60. The third sense amplifier 50 can detect the signal having the third level or more from the input data 'Data+' and 'Data−', and can amplify the signal. The third latch unit 60 can latches the third detection signals 'SA_OUT3' and 'SA_OUTB3' and then transmits the second detection signals 'SA_OUT3' and 'SA_OUTB3' to the first coder 140.

The first coder 140 can code the output signals 'SA_OUT1' and 'SA_OUTB1' of the first level detector 110, the output signals 'SA_OUT2' and 'SA_OUTB2' of the second level detector 120, and the output signals 'SA_OUT3' and 'SA_OUTB3' of the third level detector 130, and can thereby generate a first phase output signal 'RXDATA_0<1:0>'. At this time, the coding means encoding.

The second to fourth phase transmission unit 200, 300 and 400 may have the same configuration as that of the first phase transmission unit 100 except for input and output signals, a detailed description will be omitted for brevity.

Hereinafter, an operation of the first phase transmission unit 100 shown in FIG. 2 will be described. The first to third sense amplifiers 10, 30 and 50 can be driven in synchronization with the first clock signal 'CLK<1>' and can receive the data 'Data+' and 'Data−'. When the data received in the first to third sense amplifiers 10, 30 and 50 are greater than a predetermined level (for example, first to third levels), the first to third sense amplifiers 10, 30 and 50 can output signals having a high level. However, when the data received in the first to third sense amplifiers 10, 30 and 50 are smaller than the predetermined level, the first to third sense amplifiers 10, 30 and 50 can output signals having a low level. The first to third latch units 20, 40 and 60 can transmit the output signals of the first to third sense amplifiers 10, 30 and 50 to the first coder 140 by latching the output signals, respectively.

Figure 3:
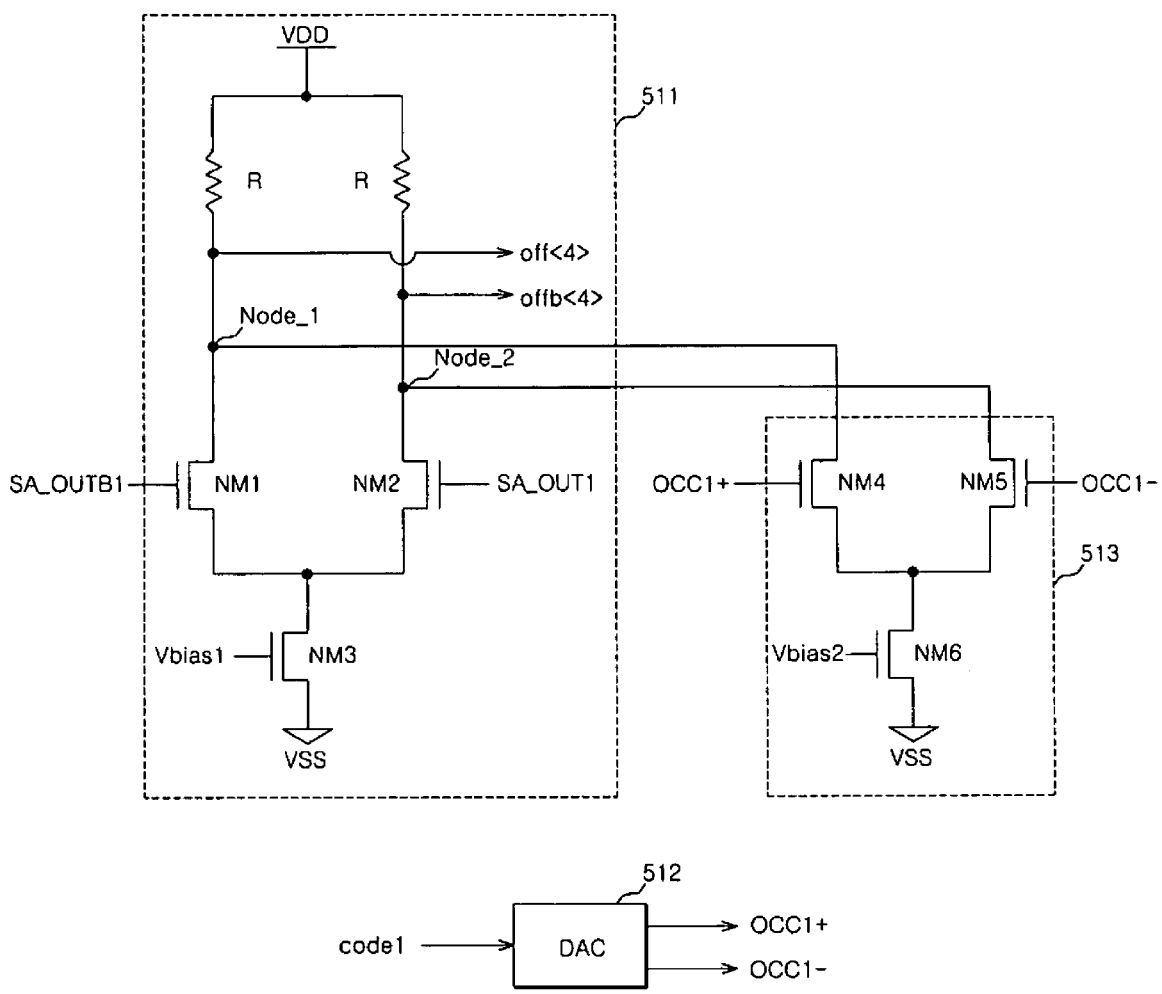
FIG. 3 is a detailed circuit diagram illustrating the first level converter that can be included in the circuit of FIG. 1.

FIG. 3 is a detailed circuit diagram illustrating the first level converter that can be included in the circuit of FIG. 1. Referring to FIG. 3, since the second to twelfth level converters 520, 530, 610, 620, 630, 710, 720, 730, 810, 820 and 830 have the same configuration as that of the first level converter 510, except for input and output signals, a detailed description will be omitted for brevity.

The first level converter 510 can control the voltage levels of the output signals 'SA_OUT1' and 'SA_OUTB1' of the first sense amplifier 10 according to the first code "code 1", and can output fourth voltages 'off<4>' and 'offb<4>' of the second offset voltage. At this time, the fourth voltages 'off<4>' and 'offb<4>' can have maximum and minimum level values determined according to the first code "code 1". The maximum and minimum level values can be determined in response to the output signals 'SA_OUT1' and 'SA_OUTB1' of the first sense amplifier 10.

The first level converter 510 can include a first level converting unit 511, a first voltage controller 512 and a first adjustor 513. The first level converting unit 511 can be configured to have a differential amplifier form and can include two resistors R, and first to third NMOS transistors NM1 to NM3. The first and second NMOS transistors NM1 and NM2 can be connected to receive the first output signals 'SA_OUT1' and 'SA_OUTB1' of the first sense amplifier 10, respectively. The third NMOS transistor NM3 can be connected to drive the first level converting unit 511 according to a first bias voltage Vbias1.

The resistor R has one end which can receive supply voltage VDD, and another end which can be connected with the first NMOS transistor NM1 or the second NMOS transistor NM2. A node, through which the resistor R is connected with the first NMOS transistor NM1, can serve as a first node Node_1. A node, through which the resistor R is connected with the second NMOS transistor NM2, can serve as a second node Node_2. The fourth voltages 'off<4>' and 'offb<4>' can be output from the first node Node_1 and the second node Node_2. The fourth voltages 'off<4>' and 'offb<4>' can be offset voltages of the fourth sense amplifier shown in FIG. 1.

Hereinafter, an operation of the first level converter 510 shown in FIG. 3 will be described. The first level converter 510 can receive the output signals of the first sense amplifier 10, and can output the fourth voltages 'off<4>' and 'offb<4>' from the first node Node_1 and the second first node Node_2 according to the voltage difference between the output signals. If the output signals 'SA_OUT1' and 'SA_OUTB1' of the first sense amplifier 10 are high and low levels, respectively, the second NMOS transistor NM2 is turned on and the fourth voltages 'off<4>' and 'offb<4>' can become high and low, respectively. In particular, the first level converter 510 can reduce the levels of the fourth voltages 'off<4>' and 'offb<4>' according to the values of the resistors R such that the level of the fourth voltage is lower than the level of the supply voltage VDD. As the resistors R have high resistance values, the intensity of the fourth voltages 'off<4>' and 'offb<4>' can be reduced.

The first voltage controller 512 can output offset control signals 'OCC1+' and 'OCC1−' according to code values 'CODE<1:N>'. The first voltage controller 512 can be a digital analog converter.

The first adjustor 513 can adjust the levels of the fourth voltages 'off<4>' and 'offb<4>' according to the offset control signals 'OCC1+' and 'OCC1−'. The first adjustor 513 can include fourth to sixth NMOS transistors NM4 to NM6.

The fourth and fifth NMOS transistors NM4 and NM5 can adjust voltages of the first node Node_1 and the second node Node_2 by receiving the offset control signals 'OCC1+' and 'OCC1−'. The sixth NMOS transistor NM6 can drive the first adjustor 513 according to a second bias voltage Vbias2. The second bias voltage Vbias2 and the offset control signals 'OCC1+' and 'OCC1−' can be adjusted, so that the levels of the fourth voltages 'off<4>' and 'offb<4>' can be additionally adjusted from the value adjusted by the first sense amplifier 10.

Figure 4:
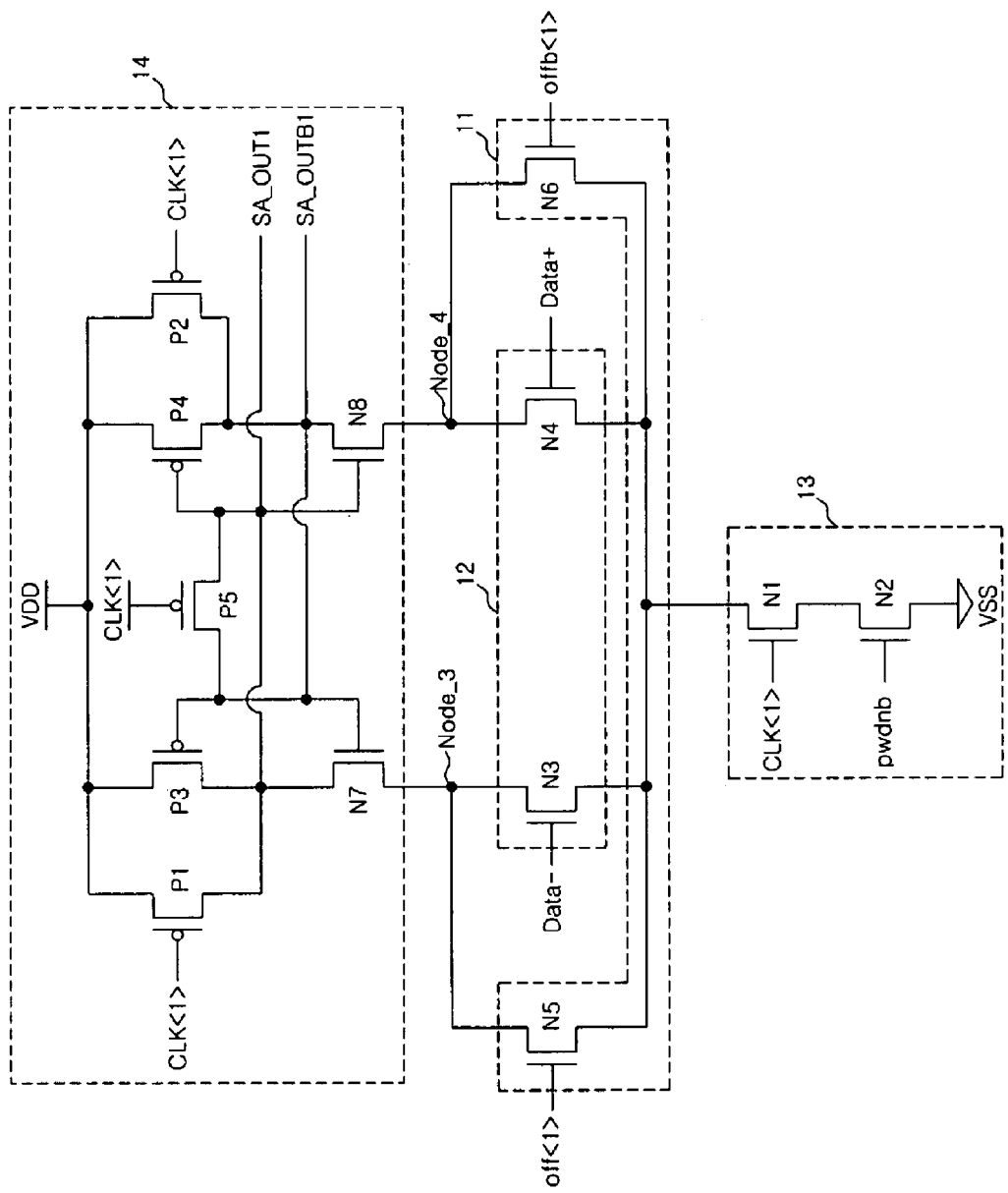
FIG. 4 is a detailed circuit diagram illustrating the first sense amplifier that can be included in the circuit of FIG. 1 and FIG. 2.

FIG. 4 is a detailed circuit diagram illustrating the first sense amplifier that can be included in the circuit of FIG. 2 and FIG. 2. Referring to FIG. 4, the first sense amplifier 10 can include a driver 13, an input comparer 12, an offset voltage comparer 11 and an amplifier 14.

The driver 13 can drive the first sense amplifier 10 according to the first clock signal 'CLK<1>' and a power-up signal 'pwdnb'. The driver 13 can include first and second NMOS transistors N1 and N2 connected in series. If the first clock signal 'CLK<1>' is enabled and the power-up signal 'pwdnb' is enabled, the first and second NMOS transistors N1 and N2 can be turned on so that a current path of the first sense amplifier 10 is provided.

The input comparer 12 can adjust the voltages of third and fourth nodes Node_3 and Node_4 according to the levels of the input data 'Data+' and 'Data−'. The input comparer 12 can include third and fourth NMOS transistors N3 and N4. The third NMOS transistor N3 can be connected between the third node N3 and the driver 13 and the fourth NMOS transistor N4 can be connected between the fourth node N4 and the driver 14.

The offset voltage comparer 11 can adjust voltages of the third and fourth nodes Node_3 and Node_4 according to the levels of the first voltages 'off<1>' and 'offb<1>'. The offset voltage comparer 11 can include fifth and sixth NMOS transistors N5 and N6. The fifth NMOS transistor N5 can be connected between the third node N3 and the driver 13 and the sixth NMOS transistor N6 can be connected between the fourth node N4 and the driver 14.

The amplifier 14 can detect and amplify the voltages of third and fourth nodes Node_3 and Node_4. The amplifier 14 can include first to fifth PMOS transistors P1 to P5 and seventh and eighth NMOS transistors N7 and N8. The first and third PMOS transistor P1 and P3 can be connected between a VDD terminal and the seventh NMOS transistor N7. The second and fourth PMOS transistor P2 and P4 can be connected between a VDD terminal and the eighth NMOS transistor N8. The first and second PMOS transistor P1 and P3 can be driven by the first clock signal 'CLK<1>'. The third PMOS transistor P3 and the seventh NMOS transistor N7 can be driven by the first output signal 'SA_OUTB1' and the fourth PMOS transistor P4 and the eighth NMOS transistor N8 can be driven by the first output signal 'SA_OUT1'.

Hereinafter, an operation of the first sense amplifier 10 shown in FIG. 4 will be described. If the first clock signal 'CLK<1>' is disabled, the first sense amplifier 10 is not driven. In detail, the first and second PMOS transistors P1 and P2 and the fifth PMOS transistor P5 can be turned on, so that the voltage levels of the output signals 'SA_OUT1' and 'SA_OUTB1' can become the levels of the supply voltage VDD. Further, if the first clock signals 'CLK<1>' is disabled, since the first NMOS transistor N1 is turned off, the current path can be blocked. Thus, an amplification operation based on the input data 'Data+' and 'Data−' is not performed.

If the power-up signal 'pwdnb' is enabled and the first clock signal 'CLK<1>' is enabled, the first and second PMOS transistors P1 and P2 and the fifth PMOS transistor P5 can be turned off and the first and second NMOS transistors N1 and N2 can be turned on. Thus, the amplification operation based on the input data 'Data+' and 'Data−' can be performed.

First, when the input data 'Data+' and 'Data−', having a level lower than that of the first voltages. 'off<1>' and 'offb<1>' are input to the first sense amplifier 10, the voltage levels of the third and fourth nodes Node_3 and Node_4 can be determined by the first voltages 'off<1>' and 'offb<1>'. Further, the first detection signals 'SA_OUT1' and 'SA_OUTB1' can have low voltage levels regardless of the voltage levels of the input data 'Data+' and 'Data−'.

However, when the input data 'Data+' and 'Data−', having a high lower than that of the first voltages, 'off<1>' and 'offb<1>' are input to the first sense amplifier 10, the voltage levels of the first detection signals 'SA_OUT1' and 'SA_OUTB1' can be determined by the voltage levels of the input data 'Data+' and 'Data−'.

Since the second and third sense amplifiers 20 and 30 have the same configuration and function as that of the first sense amplifier 10, except for offset voltage and output signals, a detailed description will be omitted for brevity.

When the output levels of the phase transmission units are used as the offset voltage, the offset voltage can be swung up to the output levels of the phase transmission units, so that the turn on/off time of the transistors of the offset voltage comparer can be increased. Thus, the setup/hold margin of the receiver circuit can be reduced. Accordingly, the output levels of the phase transmission units can be controlled by adjusting the degree of swing of the offset voltage using the level converters, so that the setup/hold margin of the receiver circuit can be improved.

As described above, the receiver circuit according to the embodiments described herein, can transmit data at an interval of 90° (clock signal phase difference), thereby achieving high speed data transmission. Further, the output voltage levels of the sense amplifiers can be adjusted by the level converters and then can be input as the offset voltages, so that the setup/hold margin of the receiver circuit can be improved.

The receiver circuit, according to the embodiments described herein, can be applied to various fields such as memories, CPUs and ASICs. Further, the receiver circuit according to the embodiments herein can detect signals based on four phase clock signals according to multi-phases. However, the scope is not limited thereto. In detail, the receiver circuit can detect signals regardless of the number of the phase clock signals.

While certain embodiments have been described above, it will be understood that the embodiments described are by way of example only. Accordingly, the descriptions herein should not be limited based on the described embodiments. Rather, the descriptions herein should only be limited in light of the claims that follow when taken in conjunction with the above description and accompanying drawings.

What is claimed is:

1. A receiver circuit comprising:
 a first phase transmission unit configured to generate a plurality of first output signals by detecting input data according to plural detection levels while being synchronized with a first clock signal, and controlling setup/hold time of the first output signals based on a level of a first offset voltage;
 a level conversion unit coupled to the first phase transmission unit, the level conversion unit configured to control voltage levels of the corresponding first output signals according to a first code; and
 a second phase transmission unit coupled to the level conversion unit, the second phase transmission unit configured to receive output signals of the level conversion unit for as a second offset voltage while being synchronized with a second clock signal, generate a plurality of second output signals by detecting the input data according to the detection levels, and control setup/hold time of the second output signals.

2. The receiver circuit of claim 1, wherein the first phase transmission unit comprises:
 a first level detector configured to detect a signal having a first level or more from the input data, amplify the signal to generate a first detection signal, and control setup/hold time of the first detection signal according to a first voltage level of the first offset voltage;
 a second level detector configured to detect a signal having a second level or more from the input data, amplify the signal to generate a second detection signal, and control setup/hold time of the second detection signal according to a second voltage level of the first offset voltage; and
 a coder coupled to the first level detector and the second level detector, the coder configured to generate the first output signal by coding the output signals of the first and second level detectors.

3. The receiver circuit of claim 2, wherein the first level detector includes:
 a first sense amplifier configured to detect the signal having the first level or more from the input data and amplify the signal, and thereby generate the first detection signal; and
 a latch unit coupled to the first sense amplifier, the latch unit configured to latch the first detection signal and transmit the first detection signal to the coder.

4. The receiver circuit of claim 3, wherein the level conversion unit includes:
 a first level converter configured to control a voltage level of the first detection signal according to the first code, and output the first detection signal to the second phase transmission unit; and
 a second level converter configured to control a voltage level of the second detection signal according to a second code, and output the second detection signal to the second phase transmission unit.

5. The receiver circuit of claim 4, wherein the first level converter includes:
 a voltage controller configured to determine a voltage level of an offset control signal according to the first code;
 an adjustor coupled to the voltage controller, the adjustor configured to control the offset voltage level in response to the offset control signal; and
 a level converting unit coupled to the adjustor, the level converting unit configured to control the offset voltage level in response to the first detection signal.

6. The receiver circuit of claim 3, wherein the first sense amplifier includes:
 a driver configured to drive the first sense amplifier as the first clock signal is enabled;
 an offset voltage comparer coupled to the driver, the offset voltage comparer configured to control the voltage of the first detection signal according to the level of the first voltage;
 an input comparer coupled to the offset voltage comparer, the input comparer configured to control a voltage of the first detection signal according to a level of the input data; and
 an amplifier coupled to the input comparer, the amplifier configured to detect and amplifying the first detection signal.

7. A receiver circuit comprising:
 a plurality of phase transmission units, each phase transmission unit configured to detect input data according to plural detection levels, and thereby generate an output signal synchronized with a predetermined clock signal, and control setup/hold time of the output signal based on a level of an offset voltage; and
 a plurality of level conversion units, each level conversion unit configured to connect between adjacent phase transmission units, receive the output signal of the previous phase transmission unit, control a voltage level of the output signal according to a predetermined code, and provide the output signal to the next phase transmission unit as the offset voltage,
 wherein the phase transmission units include a plurality of level detectors, each level detector configured with a sense amplifier.

8. The receiver circuit of claim 7, wherein the level conversion unit includes a plurality of level converters, and wherein the plurality of the level converters corresponds in number to the plurality of the level detectors.

* * * * *